(12) United States Patent
Kluckner et al.

(10) Patent No.: US 10,073,848 B2
(45) Date of Patent: Sep. 11, 2018

(54) PART IDENTIFICATION USING A PHOTOGRAPH AND ENGINEERING DATA

(71) Applicant: Siemens Aktiengesellschaft, Munich (DE)

(72) Inventors: Stefan Kluckner, Princeton, NJ (US); Arun Innanje, Princeton, NJ (US); Jan Ernst, Plainsboro, NJ (US); Terrence Chen, Princeton, NJ (US)

(73) Assignee: Siemens Aktiengesellschaft, Munich (DE)

( * ) Notice: Subject to any disclaimer, the term of this patent is extended or adjusted under 35 U.S.C. 154(b) by 381 days.

(21) Appl. No.: 14/659,918

(22) Filed: Mar. 17, 2015

(65) Prior Publication Data

US 2016/0275079 A1    Sep. 22, 2016

(51) Int. Cl.
*H04N 13/00* (2018.01)
*G06F 17/30* (2006.01)
*G06T 11/60* (2006.01)
*G06F 17/50* (2006.01)
*G06T 7/73* (2017.01)
(Continued)

(52) U.S. Cl.
CPC ........ *G06F 17/30047* (2013.01); *G06F 17/50* (2013.01); *G06K 9/00201* (2013.01); *G06T 7/0006* (2013.01); *G06T 7/74* (2017.01); *G06T 7/75* (2017.01); *G06T 11/60* (2013.01); *G06T 15/00* (2013.01); *G06K 9/4671* (2013.01); *G06T 2207/10004* (2013.01); *G06T 2207/10016* (2013.01); *G06T 2207/10028* (2013.01); *G06T 2207/20104* (2013.01)

(58) Field of Classification Search
CPC ... G06F 17/30047; G06F 17/50; G06T 15/00; G06T 11/60; G06T 7/97; G06T 7/74; G06T 7/174; G06T 2207/30244; G06K 9/6201; G06K 2009/6213
See application file for complete search history.

(56) References Cited

U.S. PATENT DOCUMENTS

2007/0008621 A1* 1/2007 Satoh ................ G06T 19/20
                                                          359/465
2010/0208057 A1* 8/2010 Meier ................ G06T 19/006
                                                          348/135

(Continued)

OTHER PUBLICATIONS

Gaskill (CADALYST—Add Model Dimensions To 2D Drawings; URL: http://cadtips.cadalyst.com/create-dimension/add-model-dimensions-2d-drawings; Published: Nov. 14, 2011). (Year: 2011).*

(Continued)

*Primary Examiner* — Sathyanaraya V Perungavoor
*Assistant Examiner* — Peet Dhillon (57) ABSTRACT

A database stores reference photographs of an assembly. The reference photographs are from different orientations relative to the assembly. By matching the query photograph to one or more of the reference photographs, the pose of the assembly in the query photograph is determined. Based on the pose, the pixels of the two-dimensional query photograph are related to a three-dimensional representation from engineering data. Using labeled parts from the engineering data, the parts represented in the query photograph are identified, and part information (e.g., segmentation, number, or other metadata) is provided relative to the query photograph.

20 Claims, 3 Drawing Sheets

(51) Int. Cl.
*G06T 15/00* (2011.01)
*G06K 9/00* (2006.01)
*G06T 7/00* (2017.01)
*G06K 9/46* (2006.01)

(56) References Cited

U.S. PATENT DOCUMENTS

2014/0101195 A1* 4/2014 Li .................. G06F 17/30277
707/769
2015/0169992 A1* 6/2015 Ioffe .................. G06K 9/6215
382/218

OTHER PUBLICATIONS

D. Nistér, et al., "Scalable Recognition with a Vocabulary Tree," CVPR, vol. 2, pp. 2161-2168, Jun. 2006.

H. Jégou, et al. "Product Quantization for Nearest Neighbor Search," IEEE Transactions on Pattern Analysis and Machine Intelligence, vol. 33, Issue 1, pp. 117-128, Jan. 2011.

O. Chum, et al., Near Duplicate Image Detection: min-Hash and tf-idf Weighting, British Machine Vision Conference, pp. 1-10, 2008.

S. Vicente, et al., "Object Cosegmentation," CVPR, pp. 1-8, 2011.

A. Irschara, et al., "From Structure-from-Motion Point Clouds to Fast Location Recognition," CVPR, pp. 2599-2606, 2009.

M. Rubinstein, et al., "Annotation Propagation in Large Image Databases via Dense Image Correspondence," ECCV, vol. 7574, pp. 1-14, 2012.

D. Harris, "Baidu built a supercomputer for deep learning," Gigaom, https://gigaom.com/2015/01/14/baidu-has-built-a-supercomputer-for-deep . . . , pp. 1-7, 2015.

"Reverse image search," Webpage, https://support.google.com/websearch/answer/1325808?p=searchbyimag . . . , pp. 1-3, 2015.

R. Sunil, "Visual Search," http://www.a9.com/whatwedo/visual-search/ . . . , pp. 1-3, 2015.

* cited by examiner

PART IDENTIFICATION USING A PHOTOGRAPH AND ENGINEERING DATA

BACKGROUND

The present embodiments relate to identifying parts in a photograph of an assembly. Various image processes have been proposed to recognize objects in an image. In computer vision, a visual search ranks similar images in an image database and uses indexing concepts. Metadata may be assigned to photographs. In location aware applications, three-dimensional models are used to render synthetic views to increase the coverage of the potential search space. Texture or other characteristics of identified objects may be extracted from the image. Image processing approaches may have difficulty dealing with common variations in photographs and/or may not provide sufficient information about the objects in the photograph.

SUMMARY

In various embodiments, systems, methods and computer readable media are provided for part identification from a query photograph. A database stores reference photographs of an assembly. The reference photographs are from different orientations relative to the assembly. By matching the query photograph to one or more of the reference photographs, the pose of the assembly in the query photograph is determined. Based on the pose, the pixels of the two-dimensional query photograph are related to a three-dimensional representation from engineering data. Using labeled parts from the engineering data, the parts represented in the query photograph are identified, and part information (e.g., segmentation, number, or other metadata) is provided to the query photograph.

In a first aspect, a system is provided for part identification. A memory is configured to store a plurality of representations of reference photographs of an assembly of parts and a three-dimensional representation of the assembly with the parts separately labeled. The reference photographs have different orientations relative to the assembly and known orientations with the three-dimensional representation. An interface is configured to receive a representation of a query photograph of the assembly or another assembly of a same type. A processor is configured to determine an orientation of a camera to the assembly or the other assembly for the query photograph from matching with the reference photographs and the different orientations and known orientations. The processor is also configured to generate an image of the query photograph with at least one of the parts labeled from the three-dimensional representation at the orientation of the camera to the assembly or other assembly.

In a second aspect, a method is provided for part identification. A pose of an assembly in a photograph is determined. A piece of the assembly is identified from a correspondence of two-dimensional locations in the photograph to three-dimensional space of a three-dimensional representation of the assembly in the pose. An image of the photograph is generated with an overlay of information for the piece.

In a third aspect, a method is provided for part identification. Spare parts in an acquired two-dimensional view are identified based on a visual search for a viewpoint of the two-dimensional view. Part related information is transferred from three-dimensional engineering data to the two-dimensional view as a function of the viewpoint.

Any one or more of the aspects described above may be used alone or in combination. These and other aspects, features and advantages will become apparent from the following detailed description of preferred embodiments, which is to be read in connection with the accompanying drawings. The present invention is defined by the following claims, and nothing in this section should be taken as a limitation on those claims. Further aspects and advantages are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

DETAILED DESCRIPTION OF EMBODIMENTS

Object labels of uniquely identified parts in three-dimensional representation from engineering data are automatically localized in a two-dimensional query photo. The part information is transferred from the engineering data to the photo. The localization of labeling identifies one or more spare parts. Automated segmentation and part-related region reporting of two-dimensional photos is provided.

Planned three-dimensional engineering data includes a large amount of relevant linked data, such as geometry, material lists, part number, design specifications, tolerance, and manufacturer information. This engineering data may not be linked to real world observations. To transfer the information to a real-world observation, a visual search scenario is used for automated identification of spare parts. The relevant viewpoint in three-dimensional space as well as a technique to transfer part related information to the two-dimensional photo domain is provided. The two-dimensional photo is coarsely localized by using an efficient image search strategy. The three-dimensional pose of the captured two-dimensional photo is determined with respect to the three-dimensional engineering data. This derived information enables the transfer of three-dimensional part labels into the image domain.

Interactive feedback to the user may be used for a visual image search scenario. The interactive feedback supports the identification of individual parts in the assembly and the extraction of assigned metadata. The operator may refine the search based on regions of interest selected in the photograph. By refining the search, specific individual parts or assemblies of parts are located and linked information is interactively reported to the user.

Ordering processes in service and maintenance domain may benefit from part identification. Augmented reality may be provided where overlays between observed data (two-dimensional photo) and planned data (three-dimensional engineering data) show internal parts. Defects and deviations may be highlighted.

Figure 1:
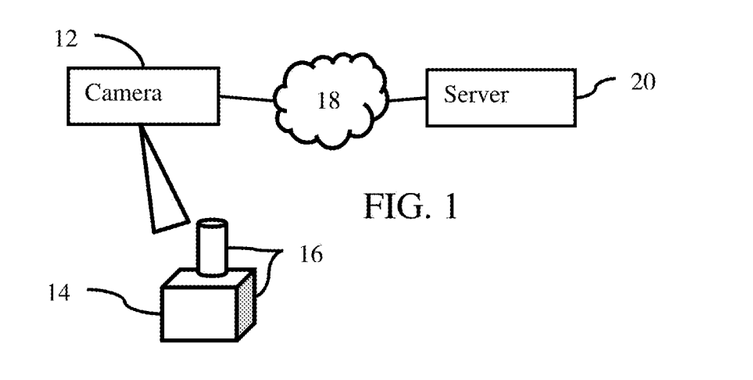
FIG. 1 is a block diagram of one embodiment of a system for identifying a part from a photograph.

FIG. 1 shows one embodiment of a system for part identification. The system includes a camera 12, network 18, and server 20. The system of FIG. 1 is directed to a remote server identifying parts 16 of the assembly 14 from a photograph taken by the camera 12. In alternative embodiments, the part identification is performed locally, such as by a processor in the camera 12 or a computer connected wirelessly or with a cable to the camera 12.

Additional, different, or fewer components may be provided. For example, a personal computer is used instead of the server and without the network 18. As another example, other cameras 12 are provided for communicating query photographs to the server 20 for the same or different types of assemblies. In another example, a display is provided for viewing label information for identified parts.

The server 20 is a network device with a processor. The server has access to or includes a memory for storing engineering data, referenced photographs, and/or label information.

The server 20 is remote from the camera 12 when the camera 12 captures a photograph of the assembly 14. Alternatively, the server 20 is local (e.g., in a same room or building) to the camera 12.

The network 18 is an intranet, enterprise network, Internet, local area network, wide area network, or other computer network. The network 18 provides communication between the camera 12 and the server 20.

The assembly 14 is any collection of multiple parts 16. In the example of FIG. 1, the assembly 14 includes two different parts 16. In other examples, three or more parts 16 are included. The parts 16 may be separable or fixed to each other. The parts 16 are of a same or different material, size, and/or shape. The parts 16 are connected together into the assembled configuration. One or more parts of an overall assembly may or may not be missing. One or more parts 16 may themselves be assemblies (e.g., a sub-assembly).

Any assembly may be used. Any physical object that may be mapped by using digital two-dimensional photos and may be represented in three-dimensional engineering data with unique labels for some of the parts may be an assembly. The assembly is at any location, such as indoors or outdoors. In one embodiment, the assembly is of a train bogie. In other embodiments, the assembly is of a manufacturing or assembly line, consumer product (e.g., keyboard or fan), buildings, or any other assembly of parts. Any assembly 14 of parts 16 that may be captured by two-dimensional photograph and represented by three-dimensional engineering data may be used.

The camera 12 is a digital camera, such as a charge-coupled device (CCD). The camera 12 is any now known or later developed camera. In one embodiment, the camera 12 is part of a mobile device, such as a tablet, cellular phone, smart phone, personal data assistant, or other handheld or carried device that integrates a camera.

The camera 12 may have a display. Alternatively, a separate display is provided for outputting annotated information from a captured photograph.

The camera 12 wirelessly connects with an interface of the server 20 through the computer network 18. Wi-Fi, Bluetooth, or other wireless connection protocol may be used. In alternative embodiments, a wired connection is used.

In a general use case represented in FIG. 1, a user captures a photograph of the assembly 14 from a given orientation relative to the assembly. The photograph may be captured at any orientation or in one of multiple defined or instructed orientations. The photograph is communicated through the network 18 to the server 20 for part identification. The server 20 relates or links engineering data stored in a database with the real world two-dimensional photograph. Using data analytics, the server 20 outputs information about one or more of the parts 16 of the assembly 14 represented in the photograph.

From the camera operator's perspective, a photograph is taken. Part information for one or more parts in the photograph is returned, such as providing smart data. Due to the short response time for the server 20 to provide the part identification, the camera operator may be able to use the smart data to assist in maintenance, ordering, or other process. For more complex assemblies, the user may be able to select a region of interest for more detailed identification or information. The server 20 interacts with the operator to provide annotations for the photograph from the engineering data.

Figure 2:
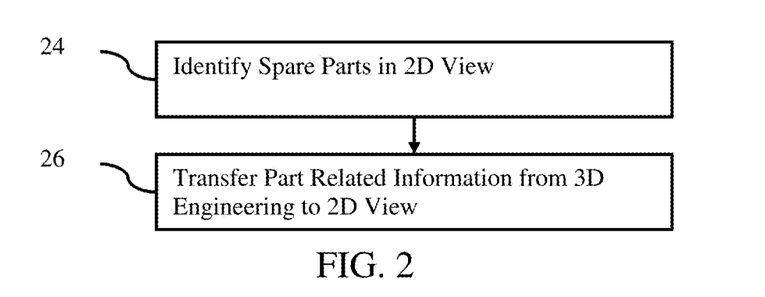
FIG. 2 is a flow chart diagram of one embodiment of a method for identifying a part from a two-dimensional view.

FIG. 2 shows one embodiment of a method for identifying one or more parts. The method is a general representation of the process for identifying a part or parts in a two-dimensional view using a three-dimensional representation from engineering data. The server or other processor performs the method.

The method is performed in the order shown, but other orders may be used. Additional, different, or fewer acts may be provided. For example, acts for capturing a two-dimensional view and/or transmitting an annotated view are added.

In act 24, one or more spare parts shown in the two-dimensional view are identified. The two-dimensional view is a photograph. Other two-dimensional views may be used instead, such as a scan using Lidar, lasers, x-rays, or other imaging.

The spare parts are any part or sub-assembly of an assembly. In the example of FIG. 1, there are two parts 16. One or both of the two parts are to be identified.

The parts are known in the engineering data. Engineering data may be computer assisted design (CAD), building information model (BIM), or other representation of the assembly of parts in three dimensions. The representation is geometrical, such as a mesh, texture, or wireframe representation. The representation may include other information as well, such as the material or materials used, texture, tolerance, color, finish, part number, installation instructions, maintenance statistics, and/or flammability.

Since the engineering data may have a different pose than the two-dimensional view, the processor identifies the spare part or parts in the two-dimensional view using a visual search for the viewpoint of the two-dimensional view. The orientation and/or scale of the two-dimensional view relative to the assembly 14 are determined. Any visual search may be used. For example, the three-dimensional representation of the assembly is rendered from different viewing directions and/or distances. The resulting images are compared with the two-dimensional view. The closest match indicates the orientation and/or scale.

As another example, an image database of views aligned to three-dimensional engineering data in the three-dimensional domain is used to localize the parts. The same assembly or a different assembly of the same type (e.g., same model or parts) are imaged (e.g., photographed) to create a database of two-dimensional views. Each of the views has a known spatial relationship with the assembly and three-dimensional representation. By matching the current two-dimensional view with a best or sufficiently matching reference two-dimensional view of the database, the viewpoint is determined, at least coarsely.

A more fine pose determination may be performed. Points in the image that relate to known locations in the three-dimensional representation may be located. The locations are used to refine the pose.

In act 26, the part related information is transferred from the three-dimensional engineering data to the two-dimensional view. The determined viewpoint indicates what part of the two-dimensional view relates to what parts in the three-dimensional representation. The three-dimensional representation as viewed from the same viewpoint as in the view of the assembly indicates what parts are seen and for what portions of the two-dimensional view.

The three-dimensional representation of the assembly includes label information for each part. These object labels from the three-dimensional engineering data are transferred to the two-dimensional view as the spare part identification. The object label transfer enables the automated segmentation of parts in the two-dimensional view with respect to their physical object boundaries.

Figure 3:
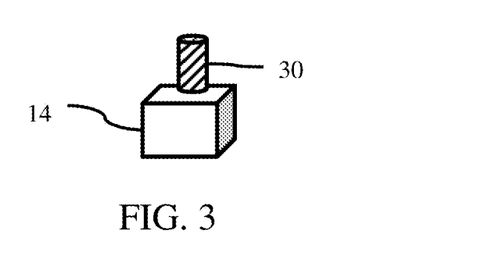
FIG. 3 is an example image with an overlay for an identified part.

FIG. 3 shows an example. The assembly 14 is imaged from an orientation as shown in FIG. 1. By determining the pose of the camera 12 relative to the assembly 14, the pixels in the two-dimensional view are assigned to respective parts 16 in three-dimensional space. The parts 16 are identified from the engineering data. FIG. 3 shows the transfer of label or object information to one of the parts 30. The part 30 is highlighted (e.g., hatch lines). Other annotation may be provided, such as connected box indicating the part name and model number (e.g., SKU number).

Figure 4:
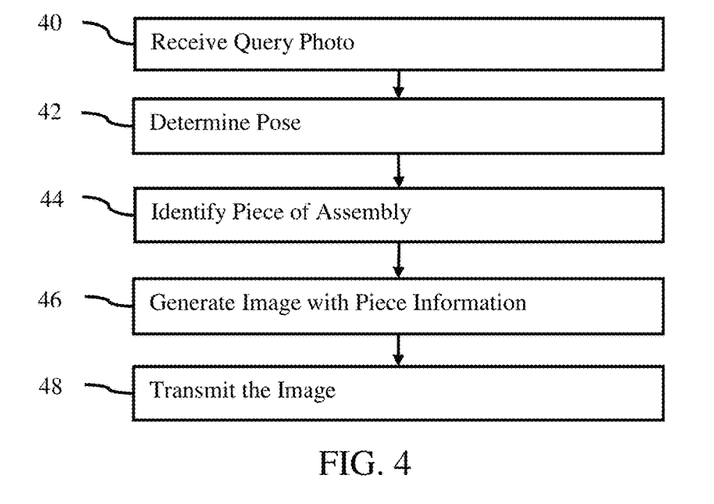
FIG. 4 is a flow chart diagram of another embodiment of a method for identifying a part from a photograph.

FIG. 4 shows another embodiment of a method for part identification. In the description below for FIG. 4, an example assembly of a train bogie is used. Other assemblies may be used. Similarly, pose estimation using a database of reference images are used in the example for FIG. 4. Other part identification processes may be used. The acts are performed in the order shown or other orders.

Figure 7:
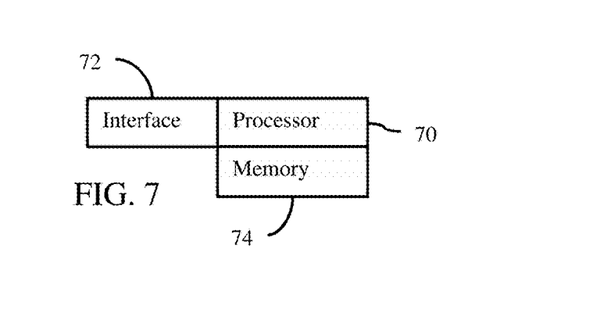
FIG. 7 is block diagram of one embodiment of a system for identifying parts from a photograph.

The method is implemented by the server 20 of FIG. 1, the system of FIG. 7, a processor, a computer, or other device or devices. Additional, different, or fewer acts may be provided. For example, acts for acquiring the photograph and transmitting the photograph for part identification are provided. As another example, acts for interactive feedback to refine (e.g., narrow) a region of interest for identifying a particular part are provided.

In act 40, a photograph is received by the server. The photograph is of an assembly from an unknown perspective. The pose of the assembly relative to the camera capturing the photograph is not known. Alternatively, the pose is one of a specific set of possibilities or is otherwise limited. For example, the train bogie may be assumed to be on the ground, so the pose is from the sides or above and not from below.

The photograph is received as a query. The photograph is provided so that part information may be provided. For example, a user of a remote mobile device wanting to know a part number for a cable cover on the train bogie takes a picture of the train bogie. This picture is sent to the server so that the cable cover part number or other label information may be returned.

In act 42, a pose of the assembly in the photograph is determined. The server or other processor determines an orientation, scale or orientation and scale. Six or other number of degrees of freedom of the pose are determined. In order to transfer part-based labels from the three-dimensional engineering data to the two-dimensional photograph, an accurate alignment of the two-dimensional query photograph with respect to the three-dimensional assembly of parts is determined.

To determine the pose, the photograph is matched with a viewpoint or viewpoints of reference photographs. For a two-dimensional query photograph, a ranked list of similar viewpoints is generated by using visual search in the database.

The database includes the three-dimensional engineering data as well as represented and indexed reference views. The reference photographs are pictures of the same assembly or a same type of assembly, but from different viewpoints (e.g., orientations and/or scales). In alternative embodiments, the references are renderings of the three-dimensional representation from different viewpoints. The indexing indicates the viewpoint for the different references. Any number of references and corresponding viewpoints may be provided, such as tens, hundreds, or thousands.

The references are from known viewpoints, so the resulting database of reference photographs are in a same coordinate system as the three-dimensional representation of the three-dimensional engineering data. The pose relative to the three-dimensional representation in each of the references is known.

In one embodiment, photographs to be used as references are taken of the assembly. The person creating the database manually aligns a rendering of the three-dimensional representation with each of the photographs, providing the indexed pose. In another embodiment, an automatic process is used where the photographs from different viewpoints are used to reconstruct the assembly, such as using structure from motion. This reconstruction in three-dimensions is aligned with the three-dimensional representation, providing a pose for each of the reference photographs. In yet another embodiment, the three-dimensional representation is rendered to two-dimensions, such as using surface rendering including texture of the parts. The rendering is performed for different viewpoints. The resulting rendered images are matched to the reference photographs. Any matching may be used, such as cross-correlation or sum of absolute differences. The rendering viewpoint for a best or sufficient match indicates the pose of three-dimensional representation for the reference photograph.

The reference photographs are searched to locate a match with the query or received photograph. The search finds a reference photograph most similar to the query photograph. In one embodiment, more than one similar viewpoint is found using the visual search. More than one reference photograph is selected as matching the query photograph.

Any measure of visual similarity may be used. For example, cross-correlation or sum of absolute differences is used.

For more rapid matching, such as associated with interactive response times, proxies for the photographs may be matched. The query photograph and the references photographs are represented compactly. The compact representations for the reference photographs are predetermined and stored in the database. The compact representation for the query photograph is generated by the mobile device to limit data bandwidth usage for transmission or is performed by the server.

Any compact representation may be used, such as a vocabulary-based search strategy. Scalable compact representations may be used. In one embodiment, SIFT is used to extract descriptors of the photographs. The results are clustered and indexed to form the compact representation. The cluster results are histogrammed as identifiers or the representations of the photographs. The histograms are compared, such as measuring L2 or L1 norm. The one or more references represented by histograms best matching the histogram of the query photograph are determined.

The matching determines the reference photographs with corresponding viewpoints (e.g., orientation and scale) of the assembly most similar to the viewpoint of the query photograph. A ranked list of similar views from the database is determined.

The pose is determined from the match or list of matches. Since reference photographs are used, the viewpoint for the best or top ranked matches may not be the same as the view point for the query photograph. While the pose may be similar, the pose may not be the same. This coarse alignment may be sufficient.

More accurate registration is performed in three-dimensional space by taking into account two-dimensional to three-dimensional correspondences. To determine a more finer pose, three or more points in the two-dimensional query photograph are located in the matching reference photograph or photographs. Since the photographs are two-dimensional, the locations are two-dimensional locations.

For each reference photograph, the underlying geometry in three dimensions is defined due to the availability of the aligned three-dimensional engineering data. The three or more points in the query photograph are located on the three-dimensional representation as aligned based on the matching reference photograph. The rotation and/or scaling to cause the three or more points to be distributed in the two-dimensional photograph are found. The three or more points from the two-dimensional space are related to the three-dimensional space from the known pose relationship of the reference photographs to the three-dimensional representation.

Any geometrical estimation of the pose may be used. In the example above, the camera pose of the two-dimensional query photograph is computed with six degrees of freedom by solving an absolute pose problem. The result is a viewpoint of the camera to the assembly and corresponding three-dimensional representation.

Where more than one match is used, the resulting poses may be averaged. Alternatively, a vote is applied. The average pose determined from the different calculated poses, whether coarse or fine, is selected.

In act 44, the server identifies a piece of the assembly from a correspondence of two-dimensional locations in the photograph to three-dimensional space of a three-dimensional representation of the assembly. The pose determined in act 42 indicates the position of the different pieces of the assembly representing in the three-dimensional representation relative to the viewpoint of the query photograph. Each pixel of the query photograph may be related to a given part of the assembly using the viewpoint aligned three-dimensional representation.

Three-dimensional engineering data provides a unique labeling of parts in the geometric space. The three-dimensional engineering data is assembled by parts, which are represented individually as meshed 3D surfaces or 3D primitives and/or part data.

This labeling is transferred to the query photograph. In a segmentation embodiment, the label transfer converts labeled surfaces of the three-dimensional representation into annotated image regions on a pixel level.

In one embodiment, the label transfer is performed by a look-up function. For each pixel from the query photograph, the corresponding three-dimensional point on the three-dimensional representation in the determined pose is found. The label for that three-dimensional point is transferred to the two-dimensional location (e.g., pixel) of the query photograph. By looking up the label from the representation, the part of the assembly shown at that location in the query photograph is identified.

In another embodiment, the three-dimensional representation is rendered. The rendering uses the determined pose or viewpoint. A surface rendering is used, such as an on-the-fly rendering with OpenGL or other rendering engine or language. The rendering may use only the visible surfaces. Alternatively, obstructed surfaces may be represented in the rendering. By rendering, the label from the surface of the three-dimensional representation is provided for a given pixel of the rendering. The rendered pixels map to the pixels of the query photograph, transferring the label and identifying one or more parts.

Figure 5:
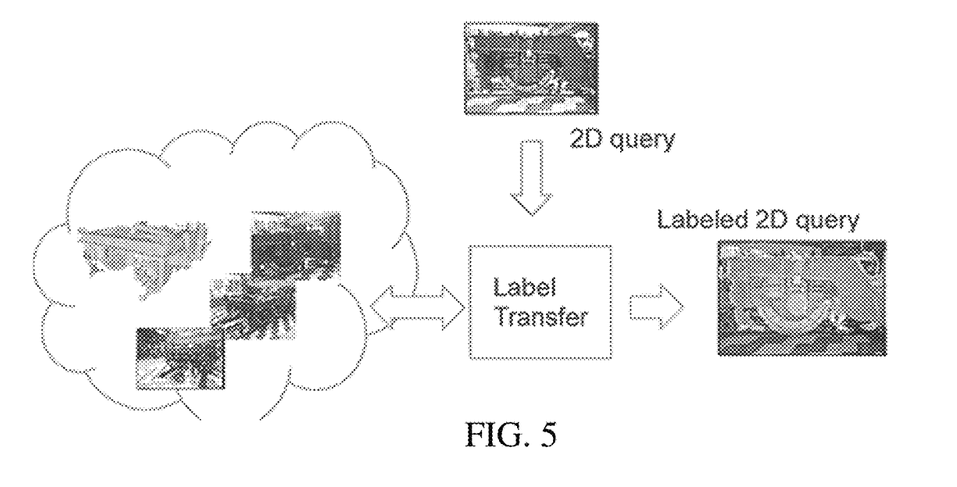
FIG. 5 illustrates a representation of data or process used for part identification.

FIG. 5 shows a representation of this approach to pose estimation using the database of reference photographs. Three photographs and a three-dimensional representation of an assembly are shown as being in a database of a cloud. The two-dimensional query photograph is used to match from the database for a label transfer. The label is transferred using the pose to generate a labeled two-dimensional query. Based on the estimated viewpoint of the two-dimensional query photograph with respect to the three-dimensional engineering data, the visible labeled parts are transferred to the two-dimensional image plane. This transfer provides an automated segmentation of the query photograph. The labeled mask is presented to the operator, who can refine the part-based search by selecting a region of interest.

Referring again to FIG. 4, an image is generated by the server in act 46. The image is of the query photograph. Alternatively, the image is of the three-dimensional representation without the photograph. The three-dimensional representation is rendered for two-dimensional viewing from a same viewpoint as the query photograph.

The image includes information from the identified piece or pieces. The information is an overlay of the photograph in one embodiment. Alternatively, the information is presented separately or adjacent to the photograph.

The information from the labeling is text, graphic, or other information. In one embodiment, the overlay is for one or more of the pieces, but has different color and/or shading to indicate segmentation. The pixels of the photograph are colored or shaded differently for different pieces, providing segmentation. A graphic overlay may instead color or shade differently. A labeling of each part as a reference is performed by assigning distinctive colors to the meshed surface. In other embodiments, a wire frame for the pieces with or without texture is generated as an overlay. The wire frame represents the boundaries of the part or parts.

Figure 6A:
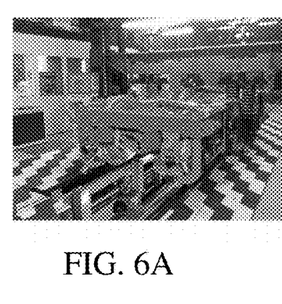
FIGS. 6A-C show example images with part overlays.
Figure 6B:
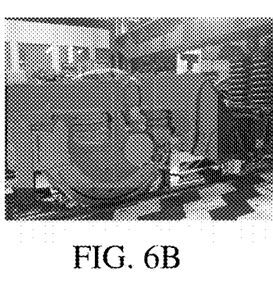
Figure 6C:
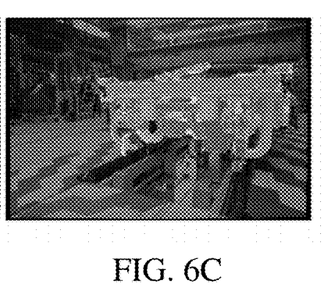

FIGS. 6A-C show example photographs with color mesh overlays. The photographs are of a train bogie from different viewpoints. The overlay or color mesh is different for the different viewpoints since different pixels correspond to different parts depending on the viewpoint. Different pieces in each of the views are colored differently. The same piece in the different views may have a same color.

In other embodiments, the information is a text box or key for other information, such as a part number, material, or installation instructions. This annotation is provided on or beside the photograph. In yet other embodiments, combinations of segmentation overlay and annotations are provided.

The information may be provided in an interactive manner. For example, the photograph is displayed to the user with color coding of the pieces of the assembly. The user selects a piece or region around the piece. The labeled query photograph is presented to the operator to enable a refined selection of relevant image regions or a sub-selection of parts. In response, an annotation listing the part number or other information is provided for the selected piece or pieces. Alternatively, a zoomed view of the segmentation is provided for further selection of yet smaller pieces.

In act 48 of FIG. 4, the image is transmitted to a display of the remote mobile device. The image may be transmitted to a different display and/or stored in a memory. The image includes the photograph. In alternative embodiments, the overlay or other information is transmitted without the query photograph. The mobile device or processor local to the display assembles the image from a stored copy of the query photograph and the label information or overlay received from the server.

Various uses may benefit from the transfer of the label information from three-dimensional engineering data to a photograph. In one example, one or more individual parts are identified for maintenance, replacement ordering, or other purpose. Based on the generated object label mask on the two-dimensional query photograph, a user may interactively search for relevant photograph regions based on the observed scene. For each selected region of interest, the operator receives label information for visible parts in the region of interest. This functionality enables the identification of parts visually. Assigned data, like material, part number, manufacturer, maintenance cycle, or other information may be provided for selected parts to assist in maintenance or ordering. An order button may be provided for placing an order for the selected part.

In another example, an augmented reality arrangement assists in understanding or maintenance on the assembly. Since the three-dimensional engineering data includes labeled part data for parts that are not visible from the outside and/or from a given viewpoint, the added overlay or other information representing the hidden parts is provided to the user. The hidden parts are represented as semi-transparent overlays on or adjacent to the photograph. Alternatively, the user selects one or more visible parts to remove, exposing the hidden parts. While the photograph may not show the hidden parts, the rendered three-dimensional representation may be used to image the hidden parts.

The identified pose may be used for initialization of a real time tracking system. The camera is used to video the assembly. As the camera moves relative to the assembly, one or more identified parts in an initial image may be used with feature tracking to alter the pose and continue to provide overlay or other part information during the video sequence.

In yet another example use, deviations of the observed assembly of the two-dimensional photograph from the three-dimensional representation of the engineering data are detected. By overlaying the rendering of the three-dimensional representation, with or without color, from the same viewpoint, differences may be highlighted. Defects, broken parts, missing parts, or other deviations may be more visible to the user. A processor may detect the deviations, such as by finding localized areas with decreased correlation between the rendering from the three-dimensional representation with texture and the photograph.

FIG. 7 is a block diagram of a system for part identification. The system is a server for identifying one or more parts of assemblies in photographs sent by remote cameras or computers. In other embodiments, the system is a computer local to (e.g., same room or building) the camera or part of a mobile device with the camera.

The system implements the method of FIG. 2 or 4. Other acts or methods may be implemented by the system.

The interface 72, processor 70 and/or memory 74 are part of a computer, personal computer, server, workstation, network processor, or other now know or later developed processing system. Various peripheral devices such as, for example, a display device, a disk storage device (e.g., a magnetic or optical disk storage device), a keyboard, a printing device, and a mouse, may be operatively coupled to the processor 70. A program may be uploaded to, and executed by, the processor 70 comprising any suitable architecture. Likewise, processing strategies may include multiprocessing, multitasking, parallel processing and the like. The processor 70 is implemented on a computer platform having hardware such as one or more central processing units (CPU), a random access memory (RAM), and input/output (I/O) interface(s). The computer platform also includes an operating system and microinstruction code.

The computer processing performed by the processor 70 may be implemented in various forms of hardware, software, firmware, special purpose processors, or a combination thereof. Some embodiments are implemented in software as a program tangibly embodied on a non-transitory program storage device. By implementing with a system or program, instructions for completely automated or semi-automated pose determination, part identification, label transfer, and/or image generation may be provided. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone or in combination.

The instructions, engineering data, three-dimensional representation of the assembly, reference photographs, representations of the reference photographs, query photograph, representation of the query photograph, generated image, overlay, and/or other information are stored in a non-transitory computer readable memory, such as the memory 74. The memory 74 is an external storage device, RAM, ROM, and/or a local memory (e.g., solid state drive or hard drive). The same or different computer readable media may be used for the instructions and other data. The memory 74 may be implemented using a database management system (DBMS) managed by the processor 70 and residing on a memory, such as a hard disk, RAM, or removable media. Alternatively, the memory 74 is internal to the processor 70 (e.g. cache).

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU or system. Because some of the constituent system components and method steps depicted in the accompanying figures are preferably implemented in software, the actual connections between the system components (or the process steps) may differ depending upon the manner in which the present embodiments are programmed.

In one embodiment, the memory 74 is configured to store a plurality of representations of reference photographs of an assembly of parts and a three-dimensional representation of the assembly with the parts separately labeled in the representation. The engineering data is provided in the form of the labels and three-dimensional representation. The three-dimensional representation is a mesh, surface, textures and primitives, or other representation of the assembly.

The stored reference photographs are of the assembly from any number of different orientations relative to the assembly. The memory 74 also stores known orientations of the references relative to the three-dimensional representation. The memory 74 alternatively or additionally stores compact representations of the photographs. For example, a vocabulary or dictionary of features or representative information (e.g., histograms from a scaling invariant feature transform (SIFT)) is stored for each reference photograph.

The interface 72 is a wireless and wired network interfaces. The interface 72 may be provided to enable electronic communication between the system and other network devices via one or more networks. In one example, the wireless network interface includes a wireless network interface controller (WNIC) with suitable transmitting and receiving components, such as transceivers, for wirelessly communicating within the network. The wired network interface may enable the network device to physically connect to the network by a wire, such as an Ethernet cable. Both wireless and wired network interfaces may be configured to facilitate communications using suitable communication protocols, such as the Internet Protocol Suite (TCP/IP). For communications, the interface 72 is configured to receive query photographs and/or representations of query photographs. Any given query photograph is of an assembly. The assembly being photographed is a same assembly photographed to create the reference photographs or is a same type of assembly but a different instance of the assembly.

The processor 70 is configured to determine an orientation of a camera to the assembly for the query photograph. The orientation is determined from matching the query photograph with reference photographs stored in the memory. The match indicates a similar or same viewpoint (e.g., angle and distance from the assembly), providing orientation and scale. The orientations of the reference photographs to the assembly and relative to the three-dimensional representation are known and stored in the memory 74. The matching provides the processor with the orientation of the camera relative to the imaged assembly. Where more than one match is used, the orientation is determined from the plurality of matches, such as by selection, averaging, or statistical combination.

The processor 70 is configured to assign location in three-dimensional space of points in the query photograph. By matching three points from the reference photographs with known three-dimensional coordinate position to the query photograph, the three-dimensional pose of the query photograph and/or alignment with the three-dimensional presentation is determined. The same three points may be matched on the three-dimensional representation. More than three points may be used for the two-dimensional to three-dimensional correspondence determination.

The processor 70 is configured to generate an image of the query photograph. The image is the query photograph, but with at least one of the parts labeled from the three-dimensional representation. Once aligned in three-dimensional space, the different parts represented at different locations in the photograph are known from the three-dimensional representation of the engineering data. Part information is available from the engineering data for each part.

The engineering data may be used for color coding an overlay of the parts on the photograph. The three-dimensional representation is rendered by the processor 70 or another processor (e.g., graphics processing unit) from the viewpoint of the camera relative to the query photograph. The rendering is color coded by part and provided as an overlay or to be displayed adjacent to the query photograph. Alternatively, the pixels of the photograph are color coded or shaded using a look up of the pixel location to three-dimensional representation surface.

In an augmented reality approach, the rendering may show internal structure of the assembly or other parts of the assembly not visible in the query photograph.

The generated image is output by the interface 72. The image is provided to the user of the camera for any of various purposes. The interface 72 may be configured to transmit and receive communications for interactive use of the part identification.

Various improvements described herein may be used together or separately. Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A system for part identification, the system comprising:
a memory configured to store a plurality of representations of reference photographs of an assembly of parts and a three-dimensional representation of the assembly with the parts separately labeled, the reference photographs having different orientations relative to the assembly and known orientations with the three-dimensional representation;
an interface configured to receive a representation of a query photograph of the assembly or another assembly of a same type; and
a processor configured to
determine an orientation of a camera to the assembly or the other assembly for the query photograph from matches with the reference photographs and the different orientations, and configured to
generate an image of the query photograph with at least one of the parts labeled from the three-dimensional representation at the orientation of the camera to the assembly or other assembly, the at least one of the parts labeled from the three-dimensional representation being a visible labeled part of the three-dimensional representation transferred as a segmentation to the two-dimensional query photograph based on results from the matches.

2. The system of claim 1 wherein the reference photographs and query photograph comprise compact representations of the photographs.

3. The system of claim 2 wherein the compact representations comprise histograms from a scaling invariant feature transform.

4. The system of claim 1 wherein the memory, interface, and processor are part of a server remote from the assembly or other assembly when the camera captures the query photograph.

5. The system of claim 4 wherein the camera comprises a camera of a mobile device wirelessly connected with the interface through a computer network.

6. The system of claim 1 wherein the processor is configured to match a plurality of the reference photographs with the query photographs and determine the orientation of the camera from the plurality of the matches.

7. The system of claim 1 wherein the processor is configured to determine a scale of the query photograph relative to the reference photographs.

8. The system of claim 1 wherein the processor is configured to determine by assigning location in three-dimensional space of points in the query photograph.

9. The system of claim 1 wherein the processor is configured to generate the image as a color coding overlay of the parts on the query photograph.

10. The system of claim 1 wherein the processor is configured to generate the image by rendering from the three-dimensional representation.

11. The system of claim 10 wherein the processor is configured to generate the image showing internal structure of the assembly or other assembly not visible in the query photograph.

12. A method for part identification, the method comprising:
   determining a pose of an assembly in a photograph;
   identifying a piece of the assembly from a correspondence of two-dimensional locations in the photograph to three-dimensional space of a three-dimensional representation of the assembly in the pose; and
   generating an image of the photograph with an overlay of information for the piece the overlay including a label based on engineering data from the three-dimensional representation transferred as a segmentation to the two-dimensional photograph.

13. The method of claim 12 wherein determining the pose comprises determining orientation and scale from a match of viewpoints in a plurality of references with the photograph.

14. The method of claim 13 wherein determining comprises comparing a compact representation of the photograph with the references comprising compact representations of the assembly from different orientations and scales.

15. The method of claim 12 further comprising:
   receiving the photograph as a query from a remote mobile device; and
   transmitting the image to a display of the remote mobile device.

16. The method of claim 12 wherein determining comprises:
   locating at least three points in the photograph as the two-dimensional locations; and
   relating the at least three points to the three-dimensional space from a known pose relationship of reference photographs to the three-dimensional representation.

17. The method of claim 12 wherein identifying comprises looking up parts of the assembly from labels of the three-dimensional representation.

18. The method of claim 12 wherein identifying comprises rendering the three-dimensional representation with a view direction based on the pose, the three-dimensional representation including a label for the piece.

19. The method of claim 12 wherein generating the image comprises generating the overlay as different color or shading for different pieces of the assembly, including the piece.

20. The method of claim 12, further comprising:
   identifying spare parts of the assembly in the photograph; and
   transferring part related information of the spare parts from three-dimensional engineering data to the overlay on the image.

* * * * *